United States Patent [19]
Doran

[11] Patent Number: 5,716,742
[45] Date of Patent: Feb. 10, 1998

[54] REAL TIME ALIGNMENT SYSTEM FOR A PROJECTION ELECTRON BEAM LITHOGRAPHIC SYSTEM

[75] Inventor: Samuel K. Doran, Wappingers Falls, N.Y.

[73] Assignee: International Business Machines Corporation, Armonk, N.Y.

[21] Appl. No.: 647,838

[22] Filed: May 15, 1996

Related U.S. Application Data

[62] Division of Ser. No. 476,471, Jun. 7, 1995, Pat. No. 5,648,188.

[51] Int. Cl.[6] .................................................. G03F 9/00
[52] U.S. Cl. ...................... 430/22; 430/296; 250/491.1
[58] Field of Search ................... 430/296, 22; 250/491.1, 250/492.2

[56] References Cited

U.S. PATENT DOCUMENTS

| | | | |
|---|---|---|---|
| 3,555,347 | 1/1971 | Dickinson | 315/18 |
| 3,838,284 | 9/1974 | McIntyre et al. | 250/385 |
| 3,942,894 | 3/1976 | Maier | 356/153 |
| 4,016,396 | 4/1977 | Hassan et al. | 219/121 |
| 4,321,510 | 3/1982 | Takigawa | 315/382 |
| 4,967,708 | 11/1990 | Linder et al. | 123/297 |
| 5,134,298 | 7/1992 | Inagaki et al. | 250/491.1 |
| 5,171,964 | 12/1992 | Booke et al. | 219/121.19 |

FOREIGN PATENT DOCUMENTS

| | | |
|---|---|---|
| 63-308317 | 12/1988 | Japan . |
| 2-102519 | 4/1990 | Japan . |

Primary Examiner—S. Rosasco
Attorney, Agent, or Firm—DeLio & Peterson, LLC; Peter W. Peterson; Eric W. Petraske

[57] ABSTRACT

A system for aligning an electron beam relative to a workpiece employs an alignment fixture immediately above the workpiece fixture through which the electron beam passes. Lateral laser alignment beams in two axes reflect off the alignment fixture to determine alignment fixture position relative to the workpiece fixture by differential interferometry. Energy alignment beams are split off from the electron beam and hit multiple diode detectors mounted on the alignment fixture. The detectors provide an output signal based on the amount of surface area hit by the energy alignment beam to determine the position of the electron beam relative to the alignment fixture. Servo controls use this real time position information to control the precise position of the electron bean relative to the workpiece by making last minute corrections to the electron beam just before it hits the workpiece.

30 Claims, 3 Drawing Sheets

REAL TIME ALIGNMENT SYSTEM FOR A PROJECTION ELECTRON BEAM LITHOGRAPHIC SYSTEM

This is a divisional of application Ser. No. 08/476,471 filed on Jun. 7, 1995 now U.S. Pat. No. 5,648,188.

BACKGROUND OF THE INVENTION

1. Field of the Invention

This invention relates to an alignment system for energy beam machining systems, such as electron beam lithographic systems, and, in particular, to a system which aligns exposure strips in real time.

2. Description of Related Art

It is important in projection electron beam lithographic systems to align each adjacent strip of pattern data on a wafer or other workpiece with high precision. If the adjacent strips overlap too much, of if they do not meet at all, errors will be produced in the lithographic pattern made on the wafer surface. This has placed higher accuracy requirements on the magnetic deflection accuracy of the electron beam column, the reticle holding the pattern mask and the stage securing the workpiece. Present alignment systems have also been sensitive to external vibration, thermal distortion and low frequency ambient electromagnetic noise, which has adversely affected their accuracy. A problem also present in many projection electron beam systems is electron beam charging due to the presence of contaminants within the column, which may result in undesired deflection effects.

An ion beam projection system produced by IMS Ion Microfabrication Systems Gmbh, Schreygasse 3, A-1020 Vienna, Austria used alignment beamlets formed with a stencil mask pattern data to align the pattern to a scanner box. The beamlets were then deflected across marks on a wafer to achieve registration to the wafer. The system was reported to make real time closed loop servo corrections of magnification and position errors during exposure. Disadvantages of this prior art system are that it requires separate deflection means for each of its alignment beams.

Bearing in mind the problems and deficiencies of the prior art, it is therefore an object of the present invention to provide an alignment system for electron beam lithographic systems and other energy beam machining systems whereby high precision beam placement may be achieved relative to the workpiece.

It is another object of the present invention to provide a high precision energy beam alignment system which does not utilize additional deflection means for each alignment beam.

A further object of the invention is to provide a high precision energy beam alignment system which reduces the accuracy required of the reticle holding the pattern mask and the stage holding the workpiece.

It is yet another object of the present invention to provide an energy beam alignment system which has reduced sensitivity to external vibration, thermal distortion and low frequency ambient electromagnetic noise.

It is a further object of the present invention to provide an alignment system which does not take up undue space on the membrane pattern mask.

Another object of the present invention is to provide an energy beam alignment system which is able to overcome deflection effects due to electron beam charging.

Still other objects and advantages of the invention will in part be obvious and will in part be apparent from the specification.

SUMMARY OF THE INVENTION

The above and other objects, which will be apparent to those skilled in the art, are achieved in the present invention which provides a method of aligning an electron beam relative to a workpiece comprising the steps of:

a) providing a source of a machining electron beam;

b) providing a workpiece fixture for securing a workpiece to be machined by the electron beam;

c) providing an alignment fixture between the electron beam source and the workpiece fixture, preferably with the alignment fixture as close as possible to the workpiece;

d) providing a source of an alignment beam which may be an energy alignment beam and/or a lateral alignment beam;

e) impinging the alignment beam on to the alignment fixture to determine the position of the electron beam relative to a workpiece secured in the workpiece fixture; and f) moving the workpiece fixture and/or alignment fixture relative to the electron beam in response to the position determined in step (e).

The alignment method may further include the steps of:

g) determining the amount of movement of the workpiece fixture relative to the electron beam in step (f);

h) moving the alignment fixture in response to the movement determined in step (g); and i) moving the electron beam relative to the workpiece by an amount proportional to the movement of the alignment fixture in step (h).

The invention provides for energy alignment beams, spatially related to the machining beam, which hit two axis sensor targets on the alignment fixture to determine the position of the machining electron beam relative to the alignment fixture. A high bandwidth, low range deflection, rotation and magnification means is provided to make final servo controlled corrections to the energy alignment beams and the machining beams so that the alignment beams precisely hit and follow their corresponding target sensors on the alignment fixture. This results in precise alignment of the machining beams to the alignment fixture all during the machining process.

This invention also provides for lateral alignment beams, preferably laser beams hitting the alignment fixture using differential laser interferometry to determine the X-Y and yaw positions of a movable stage on which is mounted the workpiece. A mechanical moving means is provided to move the alignment fixture relative to the electron beam source so that the alignment fixture is presisely servo positioned with respect to the workpiece mounted to the servo positioned X-Y and yaw stage immediately below the alignment fixture.

In another aspect, the present invention provides an apparatus for aligning an electron beam relative to a workpiece comprising a source of an electron beam a workpiece fixture for securing a workpiece to be machined by the electron beam, an alignment fixture between the electron beam source and the workpiece fixture and a source of an alignment beam which may be an energy alignment beam and/or a lateral alignment beam. There is provided means for impinging the alignment beam against the alignment fixture to determine the position of the electron beam relative to a workpiece secured in the workpiece fixture and means for moving the workpiece fixture relative to the electron beam in response to the determined position.

The preferred embodiment of the present invention provides a two part alignment system. In the first part, the workpiece fixture may be mechanically aligned with respect to the alignment fixture. A closed loop servo mechanism is employed so that the workpiece fixture makes spaced moves relative to the alignment fixture. This is accomplished by providing at least one lateral alignment beam and means for reflecting the lateral alignment beam from the alignment fixture and the workpiece fixture to determine the position of the alignment fixture relative to the workpiece fixture. The alignment fixture may be secured to the electron beam source and have a surface for reflecting the lateral alignment beam along a first axis. The workpiece fixture has a surface for reflecting the alignment beam along the first axis. Alignment beams from the lateral alignment beam source are reflected from the alignment fixture and the workpiece fixture in the first axis to determine the position of the alignment fixture relative to the workpiece fixture. The source of the lateral alignment beam may be a laser and a differential interferometer may be provided to determine the position of the workpiece fixture relative to the alignment fixture by differential interferometry.

Preferably, the alignment fixture has a surface for reflecting the lateral alignment beam along a second axis orthogonal to the first axis, and the step workpiece fixture also has a surface for reflecting the alignment beam along the second axis. Alignment beams from the lateral alignment beam source may be reflected from the alignment fixture and the workpiece fixture in the second axis to determine the position of the alignment fixture relative to the workpiece fixture. A third lateral beam may be provided along one of the first or second axes to measure yaw.

In the second part of the alignment system, an energy alignment beam spatially related to the working electron beam is provided wherein the alignment fixture receives a portion of the energy alignment beam and provides an output signal based on the amount of surface area of the alignment fixture impinged by the energy alignment beam to determine the position of the alignment fixture relative to the workpiece fixture. At least two detectors having surfaces for receiving the energy alignment beam may be located on the alignment fixture, aligned along a first axis. Each of the detectors receive a portion of the energy alignment beam and provide an output signal based on the amount of surface area impinged by the energy alignment beam. The difference of the outputs of the detectors is calculated to determine the position of the alignment beam along the first axis. The detectors may comprise PN junction diodes. A portion of the electron beam may be used to provide the alignment beam by passing it through an aperture in a mask.

More preferably, at least four detectors having surfaces for receiving the energy alignment beam are provided. The detectors are aligned along first and second axes, the axes being orthogonal to each another. Each of the detectors receives a portion of the energy alignment beam and providing an output signal based on the amount of surface area impinged by the alignment beam. The difference of the outputs of the detectors along each of the axes is calculated to determine the position of the energy alignment beam along the first axis and along the second axis. The detectors may be laid out in at least a 2×2 grid of at least two rows and two columns. Calculation of beam position is made by i) summing the outputs of each row of detectors and calculating the difference of the output of the rows to determine the centroid or position of the alignment beam along one axis, and ii) summing the outputs of each column of detectors and calculating the difference of the output of the columns to determine the centroid or position of the alignment beam along the other axis.

In a further aspect, the present invention relates to a method of aligning a workpiece in an energy beam-based machining system comprising the steps of
a) providing a source of a working energy beam;
b) providing a source of an alignment beam;
c) providing an alignment fixture secured to the working energy beam source; the alignment fixture having a surface for reflecting the alignment beam along a first axis;
d) providing a workpiece fixture for securing a workpiece to be machined by the working energy beam, the workpiece fixture having a surface for reflecting the alignment beam along the first axis;
e) reflecting alignment beams from the alignment beam source from the alignment fixture and the workpiece fixture;
f) determining the position of the workpiece fixture relative to the alignment fixture in the first axis;
g) moving the workpiece fixture relative to the alignment fixture in the first axis while repealing steps (e) and (f); and
h) aligning the workpiece fixture relative to the working energy beam.

In a related aspect, the present invention provides an apparatus for aligning a workpiece in an energy beam-based machining system comprising a source of a working energy beam, a source of an alignment beam and an alignment fixture secured to the working energy beam source; the alignment fixture having a surface for reflecting the alignment beam along a first axis. A workpiece fixture is provided for securing a workpiece to be machined by the working energy beam, the workpiece fixture having a surface for reflecting the alignment beam along the first axis. Also included are means for determining the position of the workpiece fixture relative to the alignment fixture in the first axis and means for moving and aligning the workpiece fixture relative to the alignment fixture in the first axis responsive to the determining means.

Preferably, the alignment fixture and workpiece fixture are provided with reflecting means anti operate in the manner described above in connection with the first part of the electron beam alignment system.

In yet another aspect, the present invention relates to a method of aligning an energy beam-based machining system comprising the steps of:
a) providing a working energy beam for machining a workpiece;
b) providing an alignment beam;
c) providing at least two detectors aligned along a first axis and having surfaces for receiving the alignment beam, each of the detectors receiving a portion of the alignment beam and providing an output signal based on the amount of surface area impinged by the alignment beam;
d) calculating the difference of the outputs of the detectors to determine the position of the alignment beam along the first axis; and
e) changing the position of a working energy beam based on the calculated difference of the outputs of the detectors.

The alignment method may further include the steps of:
f) moving the alignment fixture; and
g) moving the electron beam by an amount proportional to the movement of the alignment fixture in step (f).

In a related aspect, the present invention provides an apparatus for aligning an energy beam-based machining system comprising means for providing a working energy beam, means for providing an energy alignment beam; and at least two detectors aligned along a first axis and having surfaces for receiving the alignment beam. Each of the detectors are positioned to receive a portion of the alignment beam and are adapted to provide an output signal based on the amount of surface area impinged by the alignment beam. Also provided are a means for calculating the difference of the outputs of the detectors to determine the position of the alignment beam along the first axis and a means for changing the position of the working energy beam based on the calculated difference of the outputs of the detectors.

In this aspect, the detectors are arranged and operate in the manner described above in connection with the second part of the electron beam alignment system. With two energy alignment beams hitting two detector sets, yaw and magnification information about the entire machining beam may be obtained, as well as lateral position relative to the alignment fixture.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
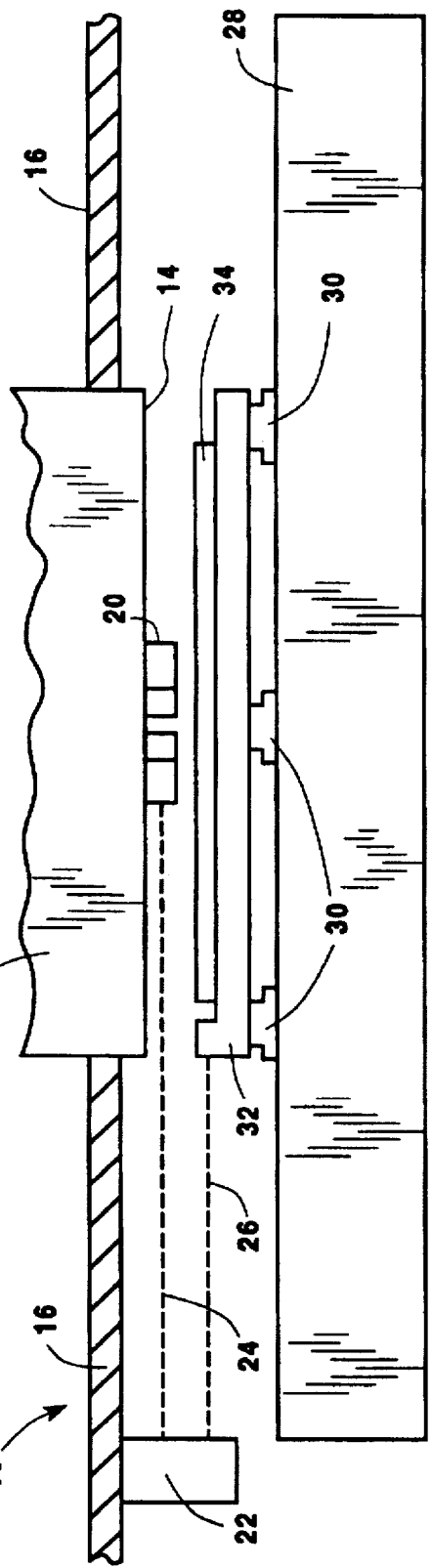
FIG. 1 is a side elevational view, partially in cross-section, of the real time alignment system for projection electron beam lithographic system of the present invention.

In describing the preferred embodiment of the present invention, reference will be made herein to FIGS. 1–5 of the drawings in which like numerals refer to like features of the invention. Features of the invention are not necessarily shown to scale in the drawings.

The present invention may be employed to align any energy beam-based machining system. As used herein (and unless otherwise indicated), the term "machining" is intended to encompass all types of material processing or removal, either partial or through the workpiece, including lithography, exposing photosensitive emulsion, exposing electron-sensitive resist, cutting, drilling, heating, heat treating, material deposition, and the like. The machining apparatus includes a means for generating a high energy working or machining beam of a continuous or pulsed nature. For the purposes of the present invention, the preferred system is used to align a charged beam system such as a projection electron beam lithographic system where the preferred high energy beam is an electron beam. The invention may also be employed with laser machining systems such as those using Nd:YAG or HeNe lasers.

This invention incorporates a system of closed loop servo mechanisms, employing components known in the art, that measure and correct in real-time the pattern placement errors from many sources in a projection electron beam lithography system. In its preferred embodiment, this invention measures the major pattern placement errors of a Projection Electron Beam lithography system with detectors located below the working beam source and immediately above the target workpiece or wafer. Measuring the errors in real-time makes it possible to null the errors with one closed loop servo operating a small range high bandwidth deflection means for the working beam.

The detectors can be part of a low mass detector assembly that can be mechanically driven with piezo actuators in another closed loop servo. The input for this servo may be a laser position transducer which measures the position difference and yaw difference between the detector assembly and the X-Y stage that transports the workpiece, such as a target wafer in a projection electron beam lithography system. This servo is responsible for eliminating residual mechanical errors down to a few nanometers between the detector assembly and the X-Y stage during the beam exposure time.

This servo system controls both the stepping and settling of the X-Y stage and the motion of the piezo actuators driving the detector assembly to make the small steps (generally on the order of a millimeter) of the X-Y stage appear perfect with respect to the detector assembly (generally on the order of within a few nanometers of position and µR of yaw). The X-Y stage with a 300 mm silicon wafer workpiece would step and settle slowly with servo bandwidths of 10–20 Hz. The detector assembly may be made with only a few grams of mass and driven with piezo actuators may achieve servo bandwidths of a few hundred Hz. This servo system coordinates the stage and detector motion so that, as the stage is settling or creeping into its final position, the detector assembly quickly moves to complete and perfect the move and track the slow final motion of the stage settling.

By determining the centroid of the two alignment beams in two axes, information about the X-Y position, yaw and magnification of the machining beams is known in real time and can be used to make last minute corrections to the machining beam just before it hits the target workpiece.

FIG. 1 shows a cross sectional view of the preferred real-time system of the present invention 10 having alignment fixture 20 positioned just below the base 14 of electron beam column 12 mounted on frame 16. Alignment fixture 20 has a slot to permit passage of a working beam from column 12 and is disposed as close to the target wafer mounted on chuck 34 as is mechanically practical. In a first portion of the alignment system of the present invention, alignment fixture 20 and X-Y stage 32 have orthogonal reflective surfaces or mirrors in the X and Y axes (described further below) which serve as the reference for differential interferometers, one of which is shown for the X-axis as interferometer 22. The laser interferometers measure the position difference between the fixture 20 mirrors and the orthogonal mirrors on stage 32. X-axis differential interferometer 22 emits lateral alignment beams 24 and 26, such as laser beams, which impinge upon and reflect from alignment fixture 20 and stage 32, respectively. The Y-axis differential interferometer (not shown) would be on an axis extending out from the drawing page in front of FIG. 1, and the Y-axis differential interferometer would emit lateral alignment beams, such as the aforementioned laser beams, which would also impinge upon and reflect from alignment fixture 20 and stage 32. Real-time changes in position of stage 32 relative to alignment fixture 20 in both X and Y axes and in yaw are calculated and determined by employing well-known differential interferometry apparatus and methods. Stage 32 is preferably a planar type that is compatible with a variable axis Emerson lens on electron beam column 20 and slides on feet 30 along the top of surface plate 28. This type of stage is described in U.S. Pat. No. 5,140,242, the disclosure of which is hereby incorporated by reference.

Alignment fixture 20 preferably has a slit for the working beam that is long in the Y axis (extending out from the page). The slit would be sufficiently large to permit all of the pattern forming working beams to pass through to wafer 34 below. Since the position of the electron beam relative to the alignment fixture is known, the position of the workpiece (wafer) on the chuck and stage relative to the electron beam is then also known.

Figure 2:
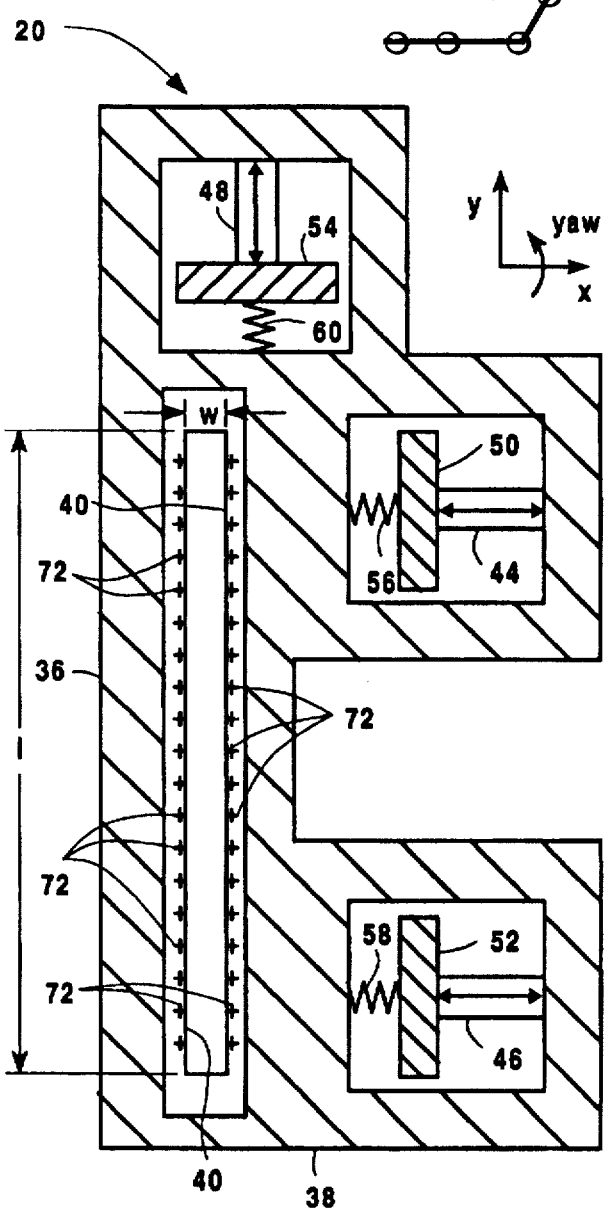
FIG. 2 is a top plan view, partially in cross-section, of the alignment fixture disposed above the target wafer in the system depicted in FIG. 1.

FIG. 2 is a top plan view of real-time alignment fixture 20 showing X and Y mirror surfaces, 36 and 38, respectively, on the side of the fixture. X-axis laser position and yaw measuring beams 24 hits X mirror 36 from the left and the Y-axis laser beam hits Y mirror 38 from the bottom, as shown in FIG. 2. X mirror surface 36 is sufficiently large to receive and reflect two spaced lateral alignment beams. Any difference in these two X-axis beams will be proportional to yaw. Alignment fixture 20 has slot opening 40 that is just large enough to allow all of the scanned pattern beam to pass through to the target wafer directly below the fixture.

To make small adjustments to the X-axis, Y-axis and yaw position of the alignment fixture, piezo actuators are employed. Fixture 20 is secured to members 50 and 52 attached to column 12 by X-axis/yaw position controlling piezo actuators 44, 46 and springs 56, 58 and is secured to member 54 attached to column 12 by Y-axis position controlling piezo actuator 48 and spring 60. These alignment fixture position changes are utilized in connection with the second portion of the alignment system of the present invention. As discussed further below, other energy alignment beams formed by the same scalier or stencil mask as used to form the pattern beam are positioned slightly wider than the pattern beams and are intercepted by the alignment fixture. The energy alignment beams hit the center of alignment targets 72 located where the "+" symbols are located along the edges or slot 40.

Figure 3:
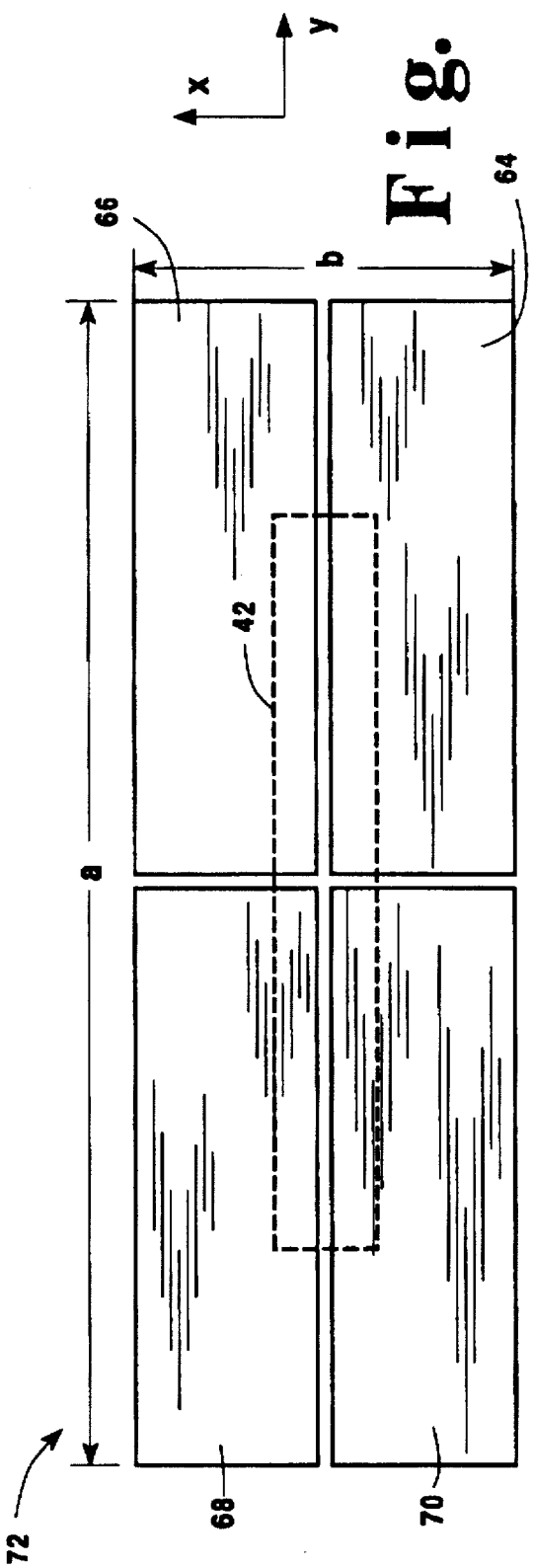
FIG. 3 is top plan view of an alignment target on which is projected an electron beam in the system depicted in FIG. 1.
Figure 4:
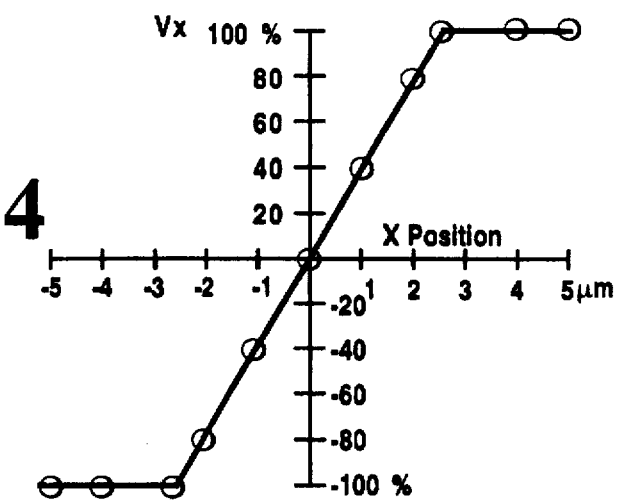
FIG. 4 is a graphical illustration of the transfer function of the signal generated by the alignment target shown in FIG. 4.

In a second portion of the aligning system of the present invention, real-time energy alignment beams emanating from column 12 are also stopped and detected by real-time alignment fixture 20. FIG. 3 is a top down view of a preferred alignment detector or target 72 made up of four PN junction diodes 64, 66, 68 and 70 aligned in a 2×2 grid. When a portion of high energy alignment electron 42 beam strikes and impinges the individual diodes, the electrons will penetrate deep into the PN junction producing many elastic and inelastic collisions. The inelastic collisions are with the electrons in the silicon atoms. Each high energy electron hit can result in many collisions, and the electrons that are hit can go on to produce many more collisions. Each inelastic collision can produce hole and electron pairs which result in formation of a reverse bias current in the diode that is proportional to the strength of the high energy beam current hitting the diode. Multiple collisions can result in a high current gain of up to 30,000 with a 100 KV electron beam.

Diodes 64, 66, 68, 70 may be operated in a reverse bias mode and the current through the diode amplified by a transimpedance operational amplifier. The amplifier converts the current through the diode to a proportional voltage. To determine the position of energy alignment beam 42 along the X-axis, the sum of the voltage produced by diodes 64, 70 having a same X-axis position is subtracted from the sum of the voltage produced by the other diodes 66, 68 having a same X-axis position, as follows:

$$V_x = (D_{64} + D_{70}) - (D_{66} + D_{68})$$

where $V_x$ is the total X-axis position voltage, $D_{64}$ is the voltage from diode 64, $D_{66}$ is the voltage from diode 66, and so on. The sum and differences of the amplifier voltages proportional to the diode current, as shown in the above formula, produces a high bandwidth signal with the transfer function shown in FIG. 4. Likewise, to determine the position of energy alignment beam 42 along the Y-axis, the sum of the voltage produced by diodes 64, 66 having a same Y-axis position is subtracted from the sum of the voltage produced by the other diodes 68, 70 having a same Y-axis position, as follows:

$$V_y = (D_{64} + D_{66}) - (D_{68} + D_{70})$$

The output signal is extremely sensitive to the position of the centroid of the alignment beam relative to the detector target diodes because a beam position change would cause current loss by one pair of diodes and current increase by the other pair of diodes. The difference signal would have signal-to-noise advantages of electronic bridge circuits.

Figure 5:
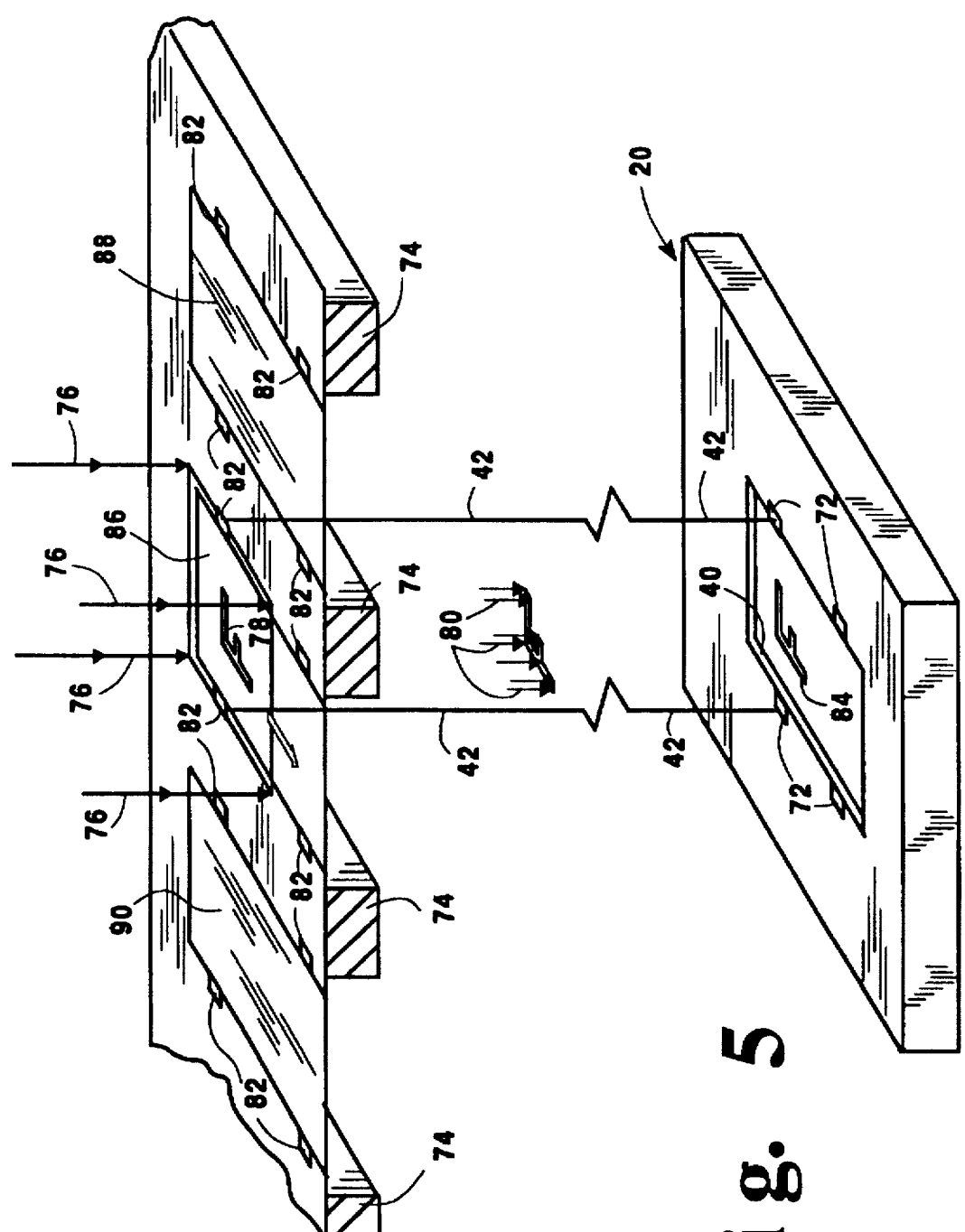
FIG. 5 is a perspective view, partially cut away, showing the alignment beams striking the alignment targets in the real time system depicted in FIG. 1.

FIG. 5 is a perspective view showing the projection lithography reticle in the upper half of the figure. Spaced grillage members 74 stiffen the individual scatter mask pattern membranes 86, 88, 90. Pattern membrane 86 is shown with a mask for a pattern feature 78 in the shape of the letter "F". The scanning flood beam from the electron beam column, shown by lines 76 at the corners, is slightly larger than the lithography pattern area and scans in the direction shown by the arrow. The portion of the scanning flood beam 76 passing through pattern 78 continues down toward the wafer as beam 80. Real-time alignment beams 42 are formed from rectangular shaped openings 82 cut out of the membrane 86 area outside of the normal pattern area but before grillage 74. Preferably, real-time alignment beams 42 are formed from a portion of, and along with, the working lithography feature electron beam. The lower part of FIG. 5 shows lithography feature 84 passing through slit 40 in real-time alignment fixture 20 as alignment beams 42 hit diode detectors 72. It should be noted that the pattern feature is shown at the same size only for purposes of illustration. Normally in a projection electron beam lithography system the pattern feature would be smaller, e.g., by a factor of five (5).

A microprocessor controlled closed loop servo system utilizing conventional components may be used to determine the deflection of scanning flood beam 76 emitted from electron beam column 12 in response to the position information determined by detectors 72. Since the position of the alignment fixture relative to the workpiece fixture (stage 32 and chuck 34) is known from the first portion of the alignment system of the present invention, the position of the projected electron beam relative to the wafer may also be controlled by deflecting the electron beam in the column in X-Y or yaw positions.

In a projection electron beam lithography system, it is particularly important for optimum operation that each strip of pattern data must join with its neighboring strip to within a few nanometers. For example, if the pattern strip is 1 mm wide, the X-Y stage must move the target wafer over exactly 1 mm to receive the next exposure strip. Any differences in the yaw of the wafer from one strip and its neighbor would also produce pattern joining errors. It is anticipated that the X-Y stage of future lithography systems will have to move 300 mm diameter wafers with travel ranges approaching 400 mm. The added mass and range of the larger wafers will make it more difficult and costly to achieve nanometer precision positioning in the X-Y stage.

This invention permits high precision positioning while allowing the requirements of stage positioning accuracy to be relaxed by a factor of 100 or 1000. The accuracy of stage 32 need only be within the physical capture range of diode detectors 72. After stage 32 positions wafer/chuck 34 to the desired position within the accuracy of the stage control system, e.g., to step the stage to align a scan of a neighboring pattern, laser position transducers as described above may then be used to measure the relative position of the alignment fixture mirrors and the X-Y stage mirrors with a resolution of 0.6 nm and fractions of µradians with only a few µseconds of time delay. The laser position and yaw data is then used to drive the piezo actuators attached to the alignment fixture as shown in FIG. 2. The movement of alignment fixture 20 with attached detectors 72 to a more precise position then causes the electron beam servo system to adjust the deflection of the working beam relative to the wafer and chuck 34 by a like or proportional amount. Utilizing a conventional microprocessor-controlled closed loop servo control system, stage position change can be calculated and the piezo actuators can move and adjust the real-time alignment fixture within a +/−10 µm range to make the 1 mm stage step appear to be perfect within a few nanometers and sub µRadian accuracy. Since the alignment fixture may be constructed with low mass, the piezo servos may have high bandwidth so they could compensate for ringing in the stage or metrology frame or stage creep while the lithographic exposure is being made.

The present invention solves the problem of aligning exposure stripes to each other by breaking alignment control into two (2) portions, as described above. The first portion involves mechanically aligning a fixture with the alignment detectors to the X-Y stage with laser position transducer and piezo actuators in a closed loop servo so that the stage appears to make perfectly spaced moves relative to the alignment fixture. The second portion involves the use of a closed loop servo to align the electron beam pattern to the detectors on the alignment fixture. These two parts of alignment control may be combined with the deflection control in an electron beam column to provide a three level servo control system to locate an electron beam precisely with respect to a workpiece all through the process of machining a lithographic pattern on a semiconductor wafer.

This invention permits relaxed stage accuracy requirements and relaxed magnetic deflection accuracy, signal-to-noise ratio, dc offset, 1/f noise, linearity, and settling time requirements. Additionally, it reduces vibration sensitivity of the metrology frame and relaxes the reticle stage accuracy requirements. Further, it reduces the reticle sensitivity to thermal distortion and reduces low frequency ambient electromagnetic magnetic noise sensitivity. It also compensates for slow deflection effects of electron beam charging above the alignment detector.

The present invention does not require the separate scanning of alignment beams as in prior art systems, with all of the additional hardware and errors that would be introduced.

Also, the alignment beams are intercepted by the alignment fixture so that alignment mark space is not required on the wafer.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An apparatus for aligning an electron beam relative to a workpiece comprising:

a source of an electron beam;

a workpiece fixture for securing a workpiece to be machined by said electron beam;

an alignment fixture between said electron beam source and said workpiece fixture;

a source of an alignment beam;

means for impinging said alignment beam against said alignment fixture to determine the position of said electron beam relative to a workpiece secured in said workpiece fixture; and means for moving said workpiece fixture relative to said electron beam and independently of said alignment fixture in response to the determined position.

2. The apparatus of claim 1 wherein said impinging means includes means for reflecting said alignment beam from said alignment fixture to determine the position of said alignment fixture relative to said workpiece fixture.

3. The apparatus of claim 2 wherein said alignment fixture has a surface for reflecting said alignment beam along a first axis and wherein said workpiece fixture has a surface for reflecting said alignment beam along said first axis, and further including means for determining the position of said workpiece fixture relative to said alignment fixture in said first axis.

4. The apparatus of claim 3 further including a first source of a pair of spaced position-measuring alignment beams along said first axis and a second source of a position-measuring alignment beam along a second axis orthogonal to said first axis, wherein said alignment and workpiece fixtures each have surfaces for reflecting said pair of position-measuring alignment beams from said first source along said first axis and for reflecting said position-measuring alignment beam from said second source along said second axis, and wherein said determining means includes means for determining the yaw of said alignment fixture relative to said workpiece fixture by a difference in said pair of position-measuring beams impinging each of said alignment and workpiece fixtures and means for determining the position of said workpiece fixture relative to said alignment fixture in said second axis.

5. The apparatus of claim 3 wherein said source of an alignment beam is a laser, and wherein said determining means comprises a differential interferometer.

6. The apparatus of claim 1 wherein said impinging means includes means for receiving a portion of said alignment beam and providing an output signal based on the amount of surface area of said alignment fixture impinged by said alignment beam to determine the position of said alignment fixture relative to said energy, machining beam.

7. The apparatus of claim 6 including: i) at least two detectors aligned along a first axis and having surfaces for receiving the alignment beam, each of said detectors being positioned to receive a portion of said alignment beam and adapted to provide an output signal based on the amount of surface area impinged by said alignment beam; ii) means for calculating the difference of the outputs of the detectors to determine the position of said alignment beam along said first axis; and iii) means for changing the position of said working energy beam based on the calculated difference of the outputs of said detectors.

8. The apparatus of claim 7 wherein said detectors comprise PN junction diodes.

9. The apparatus of claim 7 including at least four detectors having surfaces for receiving the alignment beam, said detectors being aligned along first and second axes, said axes being orthogonal to each another, each of said detectors being positioned to receive a portion of said alignment beam and adapted to provide an output signal based on the amount of surface area impinged by said alignment beam; and including means for calculating the difference of the outputs of the detectors along each of said axes to determine the position of said alignment beam along said first axis and along said second axis.

10. The apparatus of claim 9 wherein said detectors are laid out in at least a 2 ×2 grid of at least two rows and two columns, and wherein said calculating means includes means for summing the outputs of each row of detectors and calculating the difference of the output of the rows to determine the position of said alignment beam along one axis, and means for summing the outputs of each column of detectors and calculating the difference of the output of the columns to determine the position of said alignment beam along the other axis.

11. The apparatus of claim 1 including means for splitting a portion of said electron beam to provide said alignment beam.

12. The apparatus of claim 1 further including means for moving said alignment fixture in response to the movement of sad workpiece fixture; and means for moving said electron beam relative to said workpiece by an amount proportional to the movement of said alignment fixture.

13. A method of aligning an energy beam-based machining system comprising the steps of:
 a) providing a working energy beam for machining a workpiece;
 b) providing an alignment beam;
 c) providing at least two detectors aligned along a first axis and having surfaces for receiving the alignment beam, each of said detectors receiving a portion of said alignment beam and providing an output signal based on the amount of surface area impinged by said alignment beam;
 d) calculating the difference of the outputs of the detectors to determine the position of said alignment beam along said first axis; and
 e) changing the position of a working energy beam based on the calculated difference of the outputs of said detectors.

14. The method of claim 13 wherein said detectors comprise PN junction diodes.

15. The method of claim 13 wherein a portion of said working energy beam is used to provide said alignment beam.

16. The method of claim 13 further including the steps of:
 f) moving said alignment fixture; and
 g) moving said electron beam by an amount proportional to the movement of said alignment fixture in step (f).

17. The method of claim 13 including in step (c) providing at least four detectors having surfaces for receiving the alignment beam, said detectors being aligned along first and second axes, said axes being orthogonal to each another, each of said detectors receiving a portion of said alignment beam and providing an output signal based on the amount of surface area impinged by said alignment beam; and including in step (d) calculating the difference of the outputs of the detectors along each of said axes to determine the position of said alignment beam along said first axis and along said second axis.

18. The method of claim 17 wherein said detectors are laid out in at least a 2×2 grid of at least two rows and two columns, and wherein step (d) includes: i) summing the outputs of each row of detectors and calculating the difference of the output of the rows to determine the position of said alignment beam along one axis, and ii) summing the outputs of each column of detectors and calculating the difference of the output of the columns to determine the position of said alignment beam along the other axis.

19. The method of claim 18 wherein said energy beam machining system comprises a projection electron beam lithographic system.

20. An apparatus for aligning an energy beam-based machining system comprising:
 means for providing a working energy beam;
 means for providing an energy alignment beam;
 at least two detectors aligned along a first axis and having surfaces for receiving the alignment beam, each of said detectors being positioned to receive a portion of said alignment beam and adapted to provide an output signal based on the amount of surface area impinged by said alignment beam;
 means for calculating the difference of the outputs of the detectors to determine the position of said alignment beam along said first axis; and
 means for changing the position of said working energy beam based on the calculated difference of the outputs of said detectors.

21. The apparatus of claim 20 wherein said detectors comprise PN junction diodes.

22. The apparatus of claim 21 including means for splitting a portion of said working energy beam to provide said energy alignment beam.

23. The apparatus of claim 22 further including means for moving said detectors; and means for moving said working energy beam by an amount proportional to the movement of said detectors.

24. The apparatus of claim 20 including at least four detectors having surfaces for receiving the alignment beam, said detectors being aligned along first and second axes, said axes being orthogonal to each another, each of said detectors being positioned to receive a portion of said alignment beam and adapted to provide an output signal based on the amount of surface area impinged by said alignment beam; and including means for calculating the difference of the outputs of the detectors along each of said axes to determine the position of said alignment beam along said first axis and along said second axis.

25. The apparatus of claim 24 wherein said detectors are laid out in at least a 2 ×2 grid of at least two rows and two columns, and wherein said calculating means includes means for summing the outputs of each row of detectors and calculating the difference of the output of the rows to determine the position of said alignment beam along one axis, and means for summing the outputs of each column of detectors and calculating the difference of the output of the columns to determine the position of said alignment beam along the other axis.

26. The apparatus of claim 25 wherein said energy beam machining system comprises a projection electron beam lithographic system.

27. An apparatus for aligning a workpiece in an energy beam-based machining system comprising:

a source of a working energy beam;

a source of an alignment beam;

an alignment fixture secured to said working energy beam source; said alignment fixture having a surface for reflecting said alignment beam along a first axis;

a workpiece fixture for securing a workpiece to be machined by said working energy beam, said workpiece fixture having a surface for reflecting said alignment beam along said first axis;

means for determining the position of said workpiece fixture relative to said alignment fixture in said first axis;

means for moving anti aligning said workpiece fixture relative to said alignment fixture in said first axis responsive to said determining means.

28. The apparatus of claim 27 wherein said alignment fixture further has a surface for reflecting said alignment beam along a second axis orthogonal to said first axis, wherein said workpiece fixture further has a surface for reflecting said alignment beam along said second axis, and wherein said determining means includes means for determining the position of said workpiece fixture relative to said alignment fixture in said second axis.

29. The apparatus of claim 27 wherein said source of an alignment beam is a laser, and wherein said determining means comprises a differential interferometer.

30. The apparatus of claim 27 wherein said alignment fixture is secured to said working energy beam source above said workpiece fixture.

* * * * *

UNITED STATES PATENT AND TRADEMARK OFFICE
CERTIFICATE OF CORRECTION

PATENT NO. : 5,716,742
DATED : February 10, 1998
INVENTOR(S) : Samuel K. Doran

It is certified that error appears in the above-identified patent and that said Letters Patent is hereby corrected as shown below:

Column 14, Claim 27, Line 1; delete "anti" and
    insert - - and - -

Signed and Sealed this

First Day of September, 1998

BRUCE LEHMAN

Attest:

*Attesting Officer*     *Commissioner of Patents and Trademarks*